United States Patent [19]
Lingstaedt et al.

[11] Patent Number: 5,416,737
[45] Date of Patent: May 16, 1995

[54] MOS MEMORY UNIT FOR SERIAL INFORMATION PROCESSING

[75] Inventors: Ernst Lingstaedt, Zorneding; Uwe Weder, Au/Hallertau, both of Germany

[73] Assignee: Temic Telefunken microelectronic GmbH, Heilbronn, Germany

[21] Appl. No.: 194,562

[22] Filed: Feb. 10, 1994

[30] Foreign Application Priority Data

Feb. 19, 1993 [DE] Germany .................. 43 05 119.7

[51] Int. Cl.⁶ .................. G11C 11/34; G11C 7/00
[52] U.S. Cl. .................. 365/185; 365/189.12; 365/221
[58] Field of Search .............. 365/185, 189.01, 189.12, 365/78, 238, 221; 307/481; 377/26, 54

[56] References Cited

U.S. PATENT DOCUMENTS 3,648,066 3/1972 Terman .......................... 365/78 X
5,168,463 12/1992 Ikeda et al. .................... 365/78

FOREIGN PATENT DOCUMENTS

3115640A1 11/1982 Germany .
0054100 3/1986 Japan .................... 365/78
0146498 6/1987 Japan .................... 365/78
0003198 1/1991 Japan .................... 365/78

Primary Examiner—Joseph A. Popek
Assistant Examiner—Son Dinh
Attorney, Agent, or Firm—Spencer, Frank & Schneider

[57] ABSTRACT

The invention relates to a MOS memory unit for serial information processing, in particular a shift register stage with an EEPROM cell having a floating gate transistor. According to the prior art, the gate electrodes of all floating gate transistors of a memory unit have the same potential. The result is that two programming cycles must be performed for complete programming, entailing a high current consumption. In accordance with the invention, the drain electrode of the floating gate transistor is connected via an inverter stage to its gate electrode. This halves the total programming time and hence also the total programming current in comparison with the prior art.

6 Claims, 5 Drawing Sheets

MOS MEMORY UNIT FOR SERIAL INFORMATION PROCESSING

BACKGROUND OF THE INVENTION

The invention relates to a MOS memory unit for serial information processing having a first and second transfer element, with these two transfer elements being connected via a first inverter stage and with a second inverter stage being connected behind the second transfer element, and having an EEPROM cell which has a floating gate transistor and a READ transistor, with the drain electrode of the floating gate transistor being connected to the output of the first transfer element and to the input of the first inverter stage. FIG. 1 shows a known MOS memory unit of this type for serial information processing that represents a shift register cell into which data can be read in via an EEPROM cell. This shift register stage comprises in known manner two transfer elements TG1 and TG2 and two inverter stages INV1 and INV2, which are connected in series as shown in FIG. 1, with the input IN of the first transfer element TG1 representing the data input and the output OUT of the second inverter stage INV2 the data output. A further transfer element TG3 is used for feedback of the data output to the circuit node K1 connecting the first transfer element TG1 to the first inverter stage INV1. This holds the data clocked into or read into this circuit node K1. The transfer elements TG1 to TG3 are designed as CMOS transmission gates, and the inverter stages INV1 and INV2 as CMOS inverters in the known manner. The first and second transmission gates TG1 and TG2 are controlled in opposing directions with the aid of the clock signals CLOCK and CLOCKB, while the third transmission gate TG3 is controlled by means of the clock signals HOLD and HOLDB.

The circuit node K1 is connected to an EEPROM cell comprising an n-channel floating gate transistor EE1 and an associated n-channel READ transistor N1. In addition, this circuit node K1 is connected via a p-channel transistor P1 to the reference potential $V_{DD}$. The operating voltage source $V_{SS}$ supplies not only the source and substrate connection of the READ transistor N1 and the substrate connection of the floating gate transistor EE1, but also the transmission gates TG1 to TG3 and the inverter stages INV1 and INV2. The gate electrodes of the READ transistor N1 and of the floating gate transistor EE1 lead to the outside, with a READ signal being supplied to the gate electrode of this READ transistor N1 for reading out the information from the EEPROM cell.

The shift register stage with EEPROM cell according to FIG. 1 can be used for building up a shift register with n cells in which the data are serially entered into the shift register. To generate the programming voltage for the EEPROM cells, an HV (high voltage) generator is provided which is integrated with the shift register on an integrated circuit (IC). This programming voltage is supplied via the control inputs to the EEPROM cells which otherwise have the logic level.

The following is intended to explain the mode of operation of a shift register of this type, i.e. reading out of data from the EEPROM cell into a shift register stage according to FIG. 1 in conjunction with a possible read-out diagram according to FIG. 2, with the read-out operation being effected with the internal clock signal CLK shown there while the system clock signal CLOCK or CLOCKB is at logic "0" or logic "1", so that the transmission gate TG1 remains blocked during the entire read-out operation. In operation, this circuit according to FIG. 1 operates with logic levels of 0/−5 V, with the value 0 V representing logic "1" (H level) and the −5 V value logic "0" (L level). To read out the information from the EEPROM cell, a SET signal is first given according to FIG. 2 and switches the transistor P1 to conducting, with the result that the circuit node K1 is at logic level "1". Then the p-channel transistor P1 is switched to conducting with an intermediate level (not shown in FIG. 2) of the SET signal in order to generate a read-out reference current. Then a READ pulse switches the READ transistor N1 to conducting. Depending on whether the floating gate transistor EE1 is programmed with a logic "1" (i.e. corresponding to a positive threshold value voltage) or with a logic "0" (corresponding to a negative threshold value voltage), this floating gate transistor EE1 blocks or conducts. If this floating gate transistor EE1 remains blocked, the circuit node K1 remains at the logic "1" level, whereas in the other case, i.e. when the floating gate transistor EE1 is conducting, the circuit node K1 is pulled to the level of the operating voltage $V_{SS}$, i.e. to the level of the logic "0". Then the logic level read out at the circuit node K1 is fed back to the circuit node K1 by the HOLD or HOLDB signal by means of the transmission gate TG3 and the information is hence stored in the shift register. Since all EEPROM gate electrodes of a shift register cell of this type have the same potential, the drawback is that complete programming necessitates two programming cycles. In the first programming cycle, all EEPROM gate electrodes are set to the logic "1" level, i.e. to 0 V, and at the same time the input voltage $V_{SS}$ is pulled to the −18 V programming voltage generated with an HV generator. The result of this is that all floating gate transistors EE1 of which the drain electrodes are at −18 V are written and therefore programmed with a logic "1". In a second programming cycle, all EEPROM gate electrodes are supplied with the −18 V programming voltage. All floating gate transistors of which the drain electrodes are at the logic "1" level, i.e. 0 V, are now erased.

There are of course applications that only permit a low power intake from the operating voltage supply. For example, an external capacitor, which may have been charged only by a solar cell previously, can be used as the operating voltage supply for an EEPROM IC of this type.

Power input depends partly on the programming time and on the necessary current for programming. In particular, the necessary charge quantity increases if several programming steps are necessary for programming of all EEPROM cells.

SUMMARY OF THE INVENTION

The object underlying the invention is to provide a MOS memory unit of the type stated at the outset that permits programming in a single cycle.

This object is attained by the gate electrode of the floating gate transistor of the EEPROM cell being connected to the output of the first inverter stage. As a result, the logic level applying at the drain electrode of the floating gate transistor is passed with inverting effect to its gate electrode. This means that during a single programming cycle, the EEPROM cells of which the drain electrodes are at the logic "0" level after prior clocking in are written, while those EEPROM cells of which the drain electrodes are at the logic "1" level are erased. This MOS memory unit in accordance with the invention halves both the total programming time and the total programming current in comparison with the prior art.

In an advantageous development of the MOS memory unit in accordance with the invention, a first and a second supply voltage are supplied, with the first supply voltage being applied on the one hand to the source and to the substrate connection of the READ transistor and on the other hand to the substrate connection of the floating gate transistor of the EEPROM cell, and with the second partial supply voltage supplying both the transmission gate and the two inverter stages. This permits application of a variable voltage difference between the gate electrode and the source electrode of the floating gate transistor, thereby permitting determination of the shift in the threshold value voltage of the EEPROM cell, in order to ensure a certain value of the threshold value shift and hence a specified data holding time.

Furthermore, it is possible in accordance with a preferred embodiment of the invention for the third transfer element's P-MOS transistor inverting the HOLDB signal to be used for generating a read-out reference current. This has the advantage that a minimum-current DC path for generating the HOLDB signal is only required for three cycles. Otherwise, only charge reversal processes take place in the entire EEPROM IC during read-out.

Finally, it is possible in a further advantageous embodiment of the MOS memory unit in accordance with the invention to use this memory unit for providing a shift register with n cells, with the nth cell being fed back to the first cell via an inverter stage. This leads advantageously in the standby mode both to all written EEPROM cells continuing to be weakly written externally and all deleted EEPROM cells continuing to be weakly deleted externally. This measure eliminates the problem of data holding by EEPROM cells.

BRIEF DESCRIPTION OF THE DRAWINGS

The following illustrates and explains the invention on the basis of embodiments in conjunction with the figures.

In the figures, functionally identical components have the same references.

DESCRIPTION OF THE PREFERRED EMBODIMENTS

Figure 1:
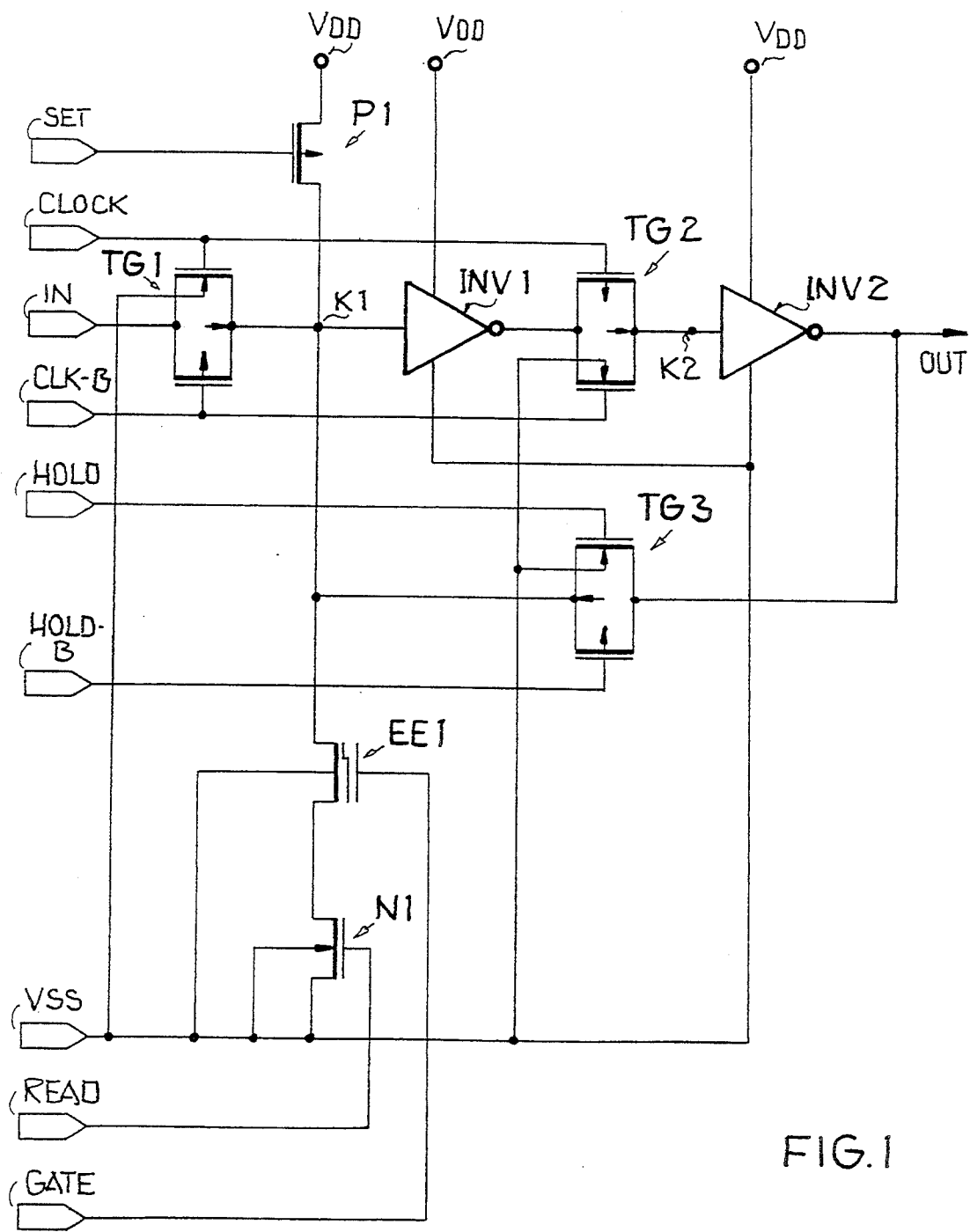
FIG. 1 shows a known MOS shift register stage with an EEPROM cell.
Figure 2:
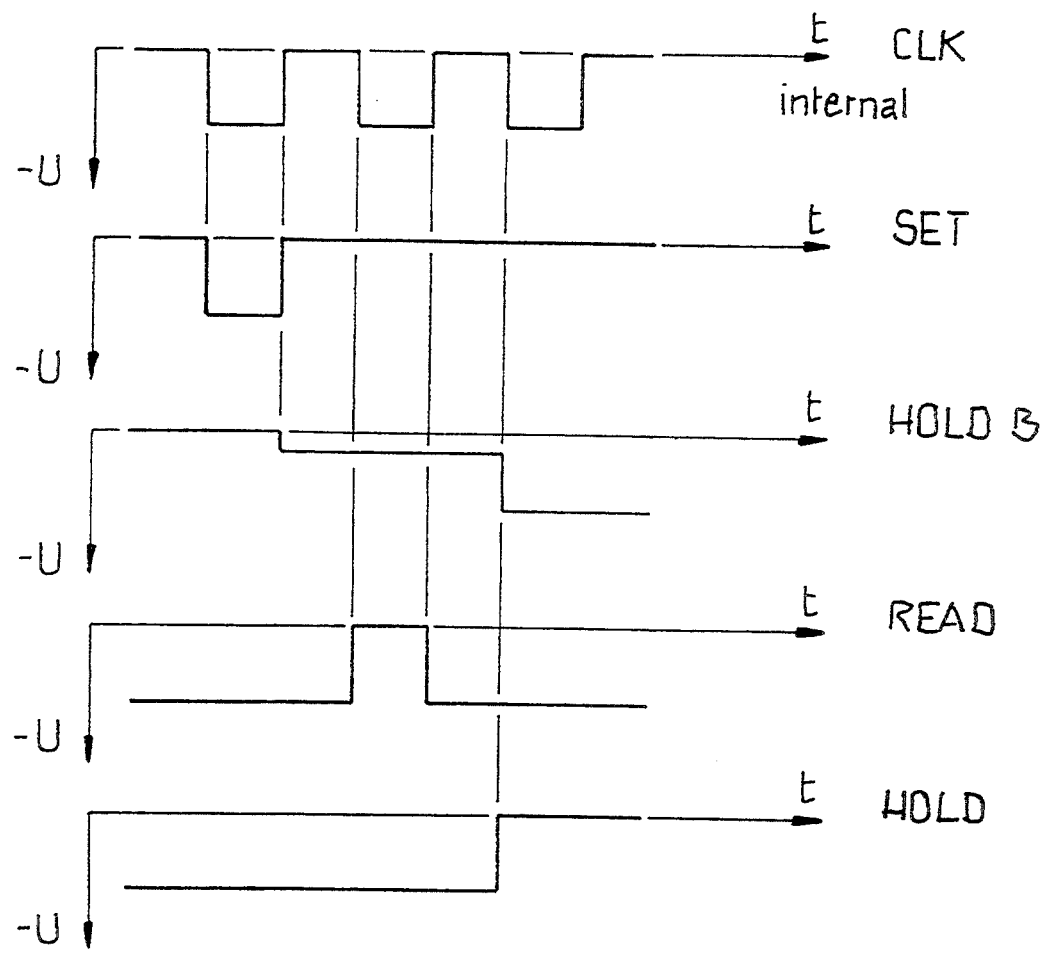
FIG. 2 shows a read-out diagram for explanation of the mode of operation of the memory unit according to FIG. 1.
Figure 3:
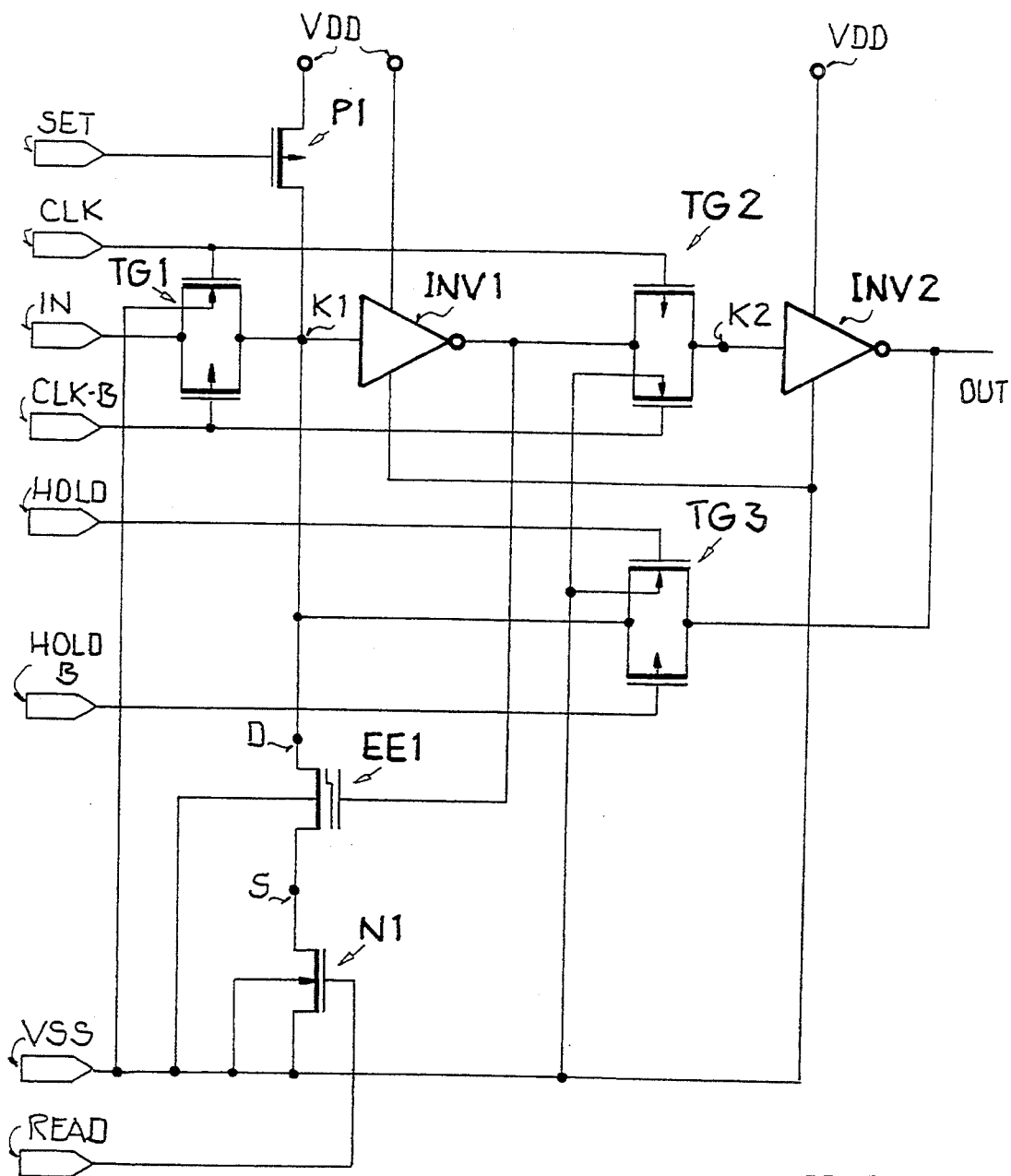
FIG. 3 shows a MOS shift register stage with EEPROM cells in accordance with the invention.

The circuit in accordance with the invention as per FIG. 3 differs from the known circuit according to FIG. 1 only in the connection of the gate electrode of the floating gate transistor EE2 to the output of the first inverter stage INV1. The following explanations therefore relate only to the functional consequences entailed by this difference. This inverter stage INV1 switches the logic levels at the drain electrode of the floating gate transistor EE1 with inverting effect to the gate electrode of the floating gate transistor EE1. To write the EEPROM cell, the logic "0" level is pulled to the value of the programming voltage, $-18$ V. If the circuit node K1, i.e. the drain electrode of the floating gate transistor EE1, is now at this level of the programming voltage, the logic "1" level, i.e. 0 V, is now applied at its gate electrode. If by contrast the circuit node K1, i.e. the drain electrode, is at the logic "1" level, i.e. 0 V, its gate electrode is supplied with the programming voltage level of $-18$ V. This means however that the EEPROM cell is erased. As a result, during a single programming cycle those EEPROM cells of which the drain electrode is at the logic "0" level after prior clocking in are written at the same time as those EEPROM cells of which the drain electrodes are at the logic "1" level are being erased. This halves both the total programming time and the required total programming current compared with the circuit according to FIG. 1. In this circuit, the read-out reference current is not generated by a transistor P1, as is the case in the FIG. 1 circuit, but with the p-channel transistor of the transmission gate TG3, which is controlled to that end using the HOLDB signal having an intermediate level according to FIG. 2.

Figure 4:
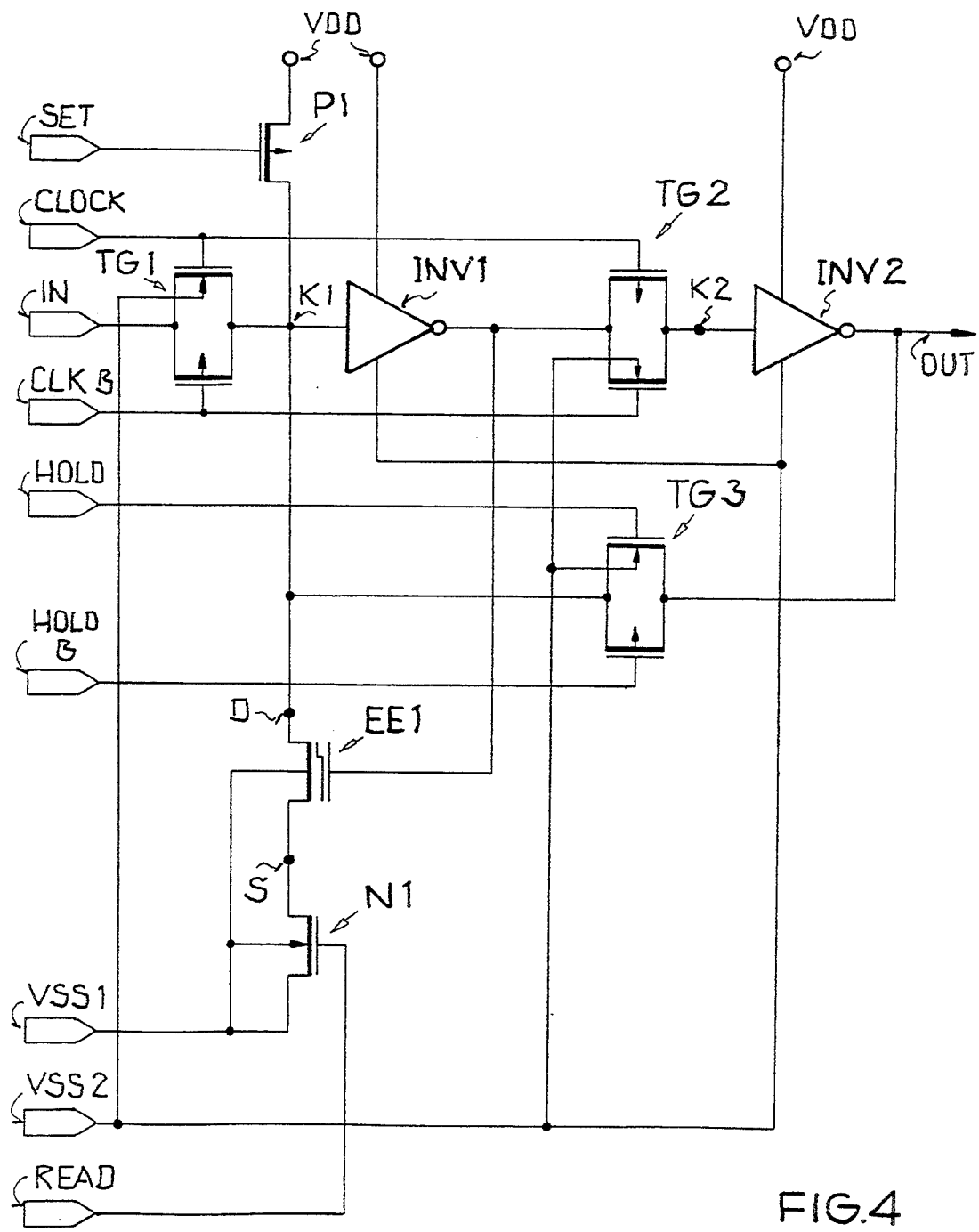
FIG. 4 shows a further embodiment of the memory unit in accordance with the invention.

A drawback of the shift register stage according to FIG. 3 is that it is not possible to ascertain the value of the threshold value shift. A certain threshold value shift must be ensured for guaranteeing a specified data holding time. To do so, the supply voltage $V_{SS}$, as in the circuit according to FIG. 3, is divided as shown in FIG. 4 into two supply voltages $V_{SS1}$ and $V_{SS2}$. The first supply voltage $V_{SS1}$ is supplied on the one hand to the source and substrate connection of the READ transistor N1 and on the other hand to the substrate connection of the floating gate transistor EE1. By contrast, the second supply voltage VSS2 supplies the transmission gates TG1 to TG3 and the two inverter stages INV1 and INV2. The mode of operation is substantially that of the circuit according to FIG. 3, with the difference being that the two supply voltages $V_{SS1}$ and $V_{SS2}$ have the same potential for both the programming and the reading function. This retains the advantage of programming in a single programming cycle.

To ascertain the threshold value of the EEPROM cell, the two supply voltages $V_{SS1}$ and $V_{SS2}$ are set to different voltage levels, so that their voltage difference can be applied to the floating gate transistor EE1 of the EEPROM cell as the gate-source voltage.

Figure 5:
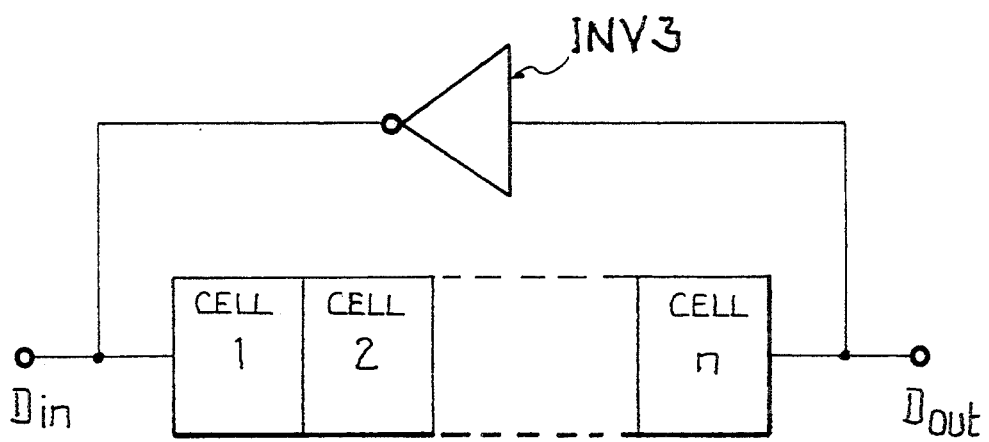
FIG. 5 shows a shift register in accordance with the invention.

The values of the threshold voltage shifts of the EEPROM cells of a shift register comprising the shift register stage according to FIG. 5 are ascertained as follows.

In a first step, a logic "1" is written into the EEPROM cell in known manner. The contents of the EEPROM cell can now be read out with a variable gate-source voltage $V_{GS}$. Typically, $V_{GS} = V_{SS2} - V_{SS1} = +2$ V is selected for the gate-source voltage, for example the first supply voltage $V_{SS1}$ remains at the logic "0" level, i.e. $-5$ V, and the second partial supply voltage $V_{SS2}$ is set to a level of $-3$ V. The logic level at the drain electrode of the floating gate transistor EE1 is supplied with inverting effect via the inverter stage INV1 to the gate electrode of the latter, where the logic level "0" is therefore applied, corresponding to the voltage level of the supply voltage $V_{SS2}$ (−3 V). The READ transistor N1 is switched through by the READ pulse, so that the source electrode of the floating gate transistor is at the level of the first supply voltage $V_{SS1}$, i.e. −5 V. The result is a gate-source voltage $V_{GS}$ of +2 V. It can now be checked whether all written bits remain at the logic "1" level, i.e. whether the n-channel floating gate transistor EE1 of the EEPROM cell blocks in spite of a positive gate-source voltage $V_{GS}$.

In a second step, all written bits are erased, i.e. logic "0" is programmed. Read-out is with a negative gate-source voltage $V_{GS}=V_{SS2}-V_{SS1}$ of typically −2 V. The voltage level of the two supply voltages are selected such that the first supply voltage $V_{SS1}$ is at the logic "0" level, i.e. −5 V, while the level for the second supply voltage $V_{SS2}$ is set to −7 V. As a result, a gate-source voltage $V_{GS}$ of −2 V is applied at the floating gate transistor EE1 of the EEPROM cell during the read-out operation. If logic "0" is now retained during read-out, the floating gate transistor EE1 of the EEPROM cells conducts in spite of the negative gate-source voltage.

The test as to whether a logic "1" or a logic "0" is retained is simply achieved by serial clocking out the bits from the shift register comprising the shift register stage according to FIG. 5. The necessary chip surface for a shift register of this type is approximately of the same size as for a shift register comprising shift register stages according to FIG. 3.

The use of the shift register stage according to FIG. 5 for provision of a dynamic shift register permits an extremely low current consumption during the reading operation, since the output OUT too goes to logic "0" when the floating gate transistor EE1 is conducting during the read-out operation and directly after the node K1 has gone to logic "0", and hence switches off the p-channel transistor of the transmission gate TG3.

Programming of a floating gate transistor is achieved by exploitation of the tunnel effect according to Fowler-Nordheim, whereby electrons tunnel through a tunnel oxide from the drain electrode to the floating gate and vice versa. To program an EEPROM cell of this type, a gate-drain voltage $V_{gd}=+/-18$ V is applied for some 10 s of ms between the gate and the drain electrodes.

In the standby mode, this gate-drain voltage $V_{gd}$ also causes a tunnel current. This extremely low tunnel current can lead to charge reversal of the EEPROM cell over a very long period of months and years. This is always the case when, in the standby mode, the gate-drain voltage $V_{gd}=-(V_{DD}-V_{SS})$ is negative at the written cell, i.e. with positive threshold voltage, or the gate-drain voltage $V_{gd}=(V_{DD}-V_{SS})$ is positive at a erased EEPROM cell, i.e. with negative threshold voltage. Even without an externally applied voltage, i.e. in the case of a gate-drain voltage $V_{gd}=0$ V, discharge takes place over a very long period. This is due to the fact that the charges situated on the floating gate generate a field opposite to the current memory state, i.e. in a written cell a very weak field with erasing polarity, and in an erased cell by contrast a very weak field with writing polarity.

If a shift register with n cells in accordance with FIG. 5 having shift register stages according to FIG. 4 or 3 is now constructed, it is ensured by circuitry measures that in the standby mode both all written EEPROM cells continue to be written externally, although very weakly, and all erased EEPROM cells continue to be erased externally, although also very weakly. This is achieved on the one hand by the data serially clocked out at the nth cell of the shift register being passed to the first cell via an inverter stage INV3 and on the other hand by the gate electrodes of the EEPROM cells according to FIGS. 3 and 4 being connected to the output of the first inverter stage INV1.

To write a logic "1" into the EEPROM cell, the drain electrode of the floating gate transistor EE1 is applied to −18 V, therefore corresponding to logic "0", and its gate electrode to 0 V, corresponding to logic "1". Since the n-channel floating gate transistor EE1 has a positive threshold value voltage, it remains blocked during the reading operation, i.e. the drain electrode is at 0 V, corresponding to logic "1", while the gate electrode is at −5 V, corresponding to logic "0". By a renewed inverted read-in by means of the inverter stage INV3 in accordance with FIG. 5 during serial clocking out of the shift register, the drain electrode is at −5 V, i.e. at the logic "0" level, and the gate electrode at 0 V, i.e. the logic "1" level. With this gate-drain voltage $V_{gd}$, the EEPROM cell is biased in the same direction with regard to the current memory state. This outer voltage $V_{gd}$ counters the inner field described above. As a result, a high threshold value is ensured in the long term too. It is therefore guaranteed in a erased EEPROM cell too that after serial clocking out a gate-drain voltage $V_{gd}$ is applied at the floating gate transistor EE1, the field of which also counters the inner field.

In conclusion, therefore, it can be stated that a logic "0" is applied at the drain electrode of every written EEPROM cell, and at its gate electrode a logic "1", and that a logic "1" is applied at the drain electrode of every deleted EEPROM cell, and at its gate electrode a logic "0".

This prevents long-term data losses, eliminates lengthy testing procedures for ensuring a minimum data holding time, and considerably increases the yield when EEPROM ICs of this type are manufactured.

What is claimed is:

1. A MOS memory unit for serial information processing having a first and second transfer element (TG1, TG2), with said first and second two transfer elements being connected via a first inverter stage (INV1) and with a second inverter stage (INV2) being connected behind said second transfer element (TG2), and having an EEPROM cell which has a floating gate transistor (EE1) and a READ transistor (N1), with the drain electrode of said floating gate transistor (EE1) being connected to the output of said first transfer element (TG1) and to the input of said first inverter stage (INV1), wherein said gate electrode of said floating gate transistor is connected to the output of said first inverter stage (INV1).

2. A MOS memory unit according to claim 1, having a third transfer element (TG3), which feeds back the output of said second inverter stage (INV2) to the drain electrode of said floating gate transistor (EE1), characterized by the following features:
   a) a first and a second supply voltage ($V_{SS1}$, $V_{SS2}$) are provided,
   b) said first supply voltage ($V_{SS1}$) is applied on the one hand to the source connection and substrate connection of said READ transistor (N1), and on the other hand to the substrate connection of said floating gate transistor (EE1), and c) said second supply voltage ($V_{SS2}$) is supplied to said three transfer elements (TG1, TG2, TG3) and said two inverter stages (INV1, INV2).

3. A MOS memory unit according to claim 2, wherein a HOLDB signal having an intermediate level in addition to an H level and an L level is supplied to the p-channel transistor of said third transfer element (T3) for generation of a read-out reference current.

4. The MOS memory unit according to claim 3, wherein said memory unit is used to construct a shift register with n cells, with the nth cell being fed back to the first cell via an inverter stage (INV3).

5. A method of constructing a shift register with n cells, comprising:

utilizing the MOS memory unit according to claim 3 for each of the memory cells in the shift register; and feeding the nth cell back to the first cell via an inverter stage.

6. A shift register, comprising:

a serial connection of n cells, each of said cells comprised of the MOS memory unit according to claim 3; and a feed back circuit including an inverter stage connected between an output of the nth cell and an input of the first cell of the serial connection of n cells for feeding back the output of the nth cell to the input of the first cell via said inverter stage.

* * * * *